US012618172B2

(12) United States Patent
Kubota et al.

(10) Patent No.: US 12,618,172 B2
(45) Date of Patent: May 5, 2026

(54) SEED SUBSTRATE FOR EPITAXIAL GROWTH USE AND METHOD FOR MANUFACTURING SAME, AND SEMICONDUCTOR SUBSTRATE AND METHOD FOR MANUFACTURING SAME

(71) Applicants: SHIN-ETSU CHEMICAL CO., LTD., Tokyo (JP); SHIN-ETSU HANDOTAI CO., LTD., Tokyo (JP)

(72) Inventors: Yoshihiro Kubota, Gunma (JP); Ippei Kubono, Gunma (JP)

(73) Assignees: SHIN-ETSU CHEMICAL CO., LTD., Tokyo (JP); SHIN-ETSU HANDOTAI CO., LTD., Tokyo (JP)

( * ) Notice: Subject to any disclaimer, the term of this patent is extended or adjusted under 35 U.S.C. 154(b) by 454 days.

(21) Appl. No.: 18/279,023

(22) PCT Filed: Mar. 4, 2022

(86) PCT No.: PCT/JP2022/009490
§ 371 (c)(1),
(2) Date: Aug. 25, 2023

(87) PCT Pub. No.: WO2022/191079
PCT Pub. Date: Sep. 15, 2022

(65) Prior Publication Data
US 2024/0141552 A1 May 2, 2024

(30) Foreign Application Priority Data

| | | |
|---|---|---|
| Mar. 10, 2021 | (JP) | 2021-038731 |
| Jun. 14, 2021 | (JP) | 2021-098993 |

(51) Int. Cl.
C30B 25/18 (2006.01)
C23C 16/30 (2006.01)
(Continued)

(52) U.S. Cl.
CPC .......... C30B 25/186 (2013.01); C23C 16/301 (2013.01); C23C 16/308 (2013.01);
(Continued)

(58) Field of Classification Search
CPC ..................... H01L 21/02645; H10D 62/8503
See application file for complete search history.

(56) References Cited

U.S. PATENT DOCUMENTS 5,373,804 A * 12/1994 Tachimori ............... C30B 29/06
117/20
9,840,790 B2 12/2017 Koukitu et al.
(Continued)

FOREIGN PATENT DOCUMENTS

JP H09-52798 A 2/1997
JP H09-213635 A 8/1997
(Continued)

OTHER PUBLICATIONS

May 26, 2025 Extended European Search Report issued in European Patent Application No. 22767036.1.
(Continued)

*Primary Examiner* — Chad M Dicke
*Assistant Examiner* — Jeremy Daniel Watts
(74) *Attorney, Agent, or Firm* — Oliff PLC

(57) ABSTRACT

A seed substrate for epitaxial growth has a support substrate, a planarizing layer of 0.5 to 3 μm provided on the top surface of the support substrate, and a seed crystal layer provided on the top surface of the planarizing layer. The support substrate includes a core of group III nitride polycrystalline ceramics and a 0.05 to 1.5 μm encapsulating layer that encapsulates the core. The seed crystal layer is provided by thin-film transfer of 0.1 to 1.5 μm of the surface layer of Si<111> single crystal with oxidation-induced stacking faults (OSF) of 10 defects/cm$^2$ or less. High-quality, inex-
(Continued)

pensive seed substrates with few crystal defects for epitaxial growth of epitaxial substrates and solid substrates of group III nitrides such as AlN, AlxGa1-xN (0<X<1) and GaN are obtained.

21 Claims, 2 Drawing Sheets

(51) Int. Cl.

| | |
|---|---|
| *C23C 16/34* | (2006.01) |
| *C23C 16/40* | (2006.01) |
| *C23C 16/50* | (2006.01) |
| *C30B 29/40* | (2006.01) |
| *C30B 31/22* | (2006.01) |
| *H01L 21/02* | (2006.01) |
| *H10D 62/85* | (2025.01) |

(52) U.S. Cl.
CPC .......... *C23C 16/345* (2013.01); *C23C 16/402* (2013.01); *C23C 16/50* (2013.01); *C30B 29/403* (2013.01); *C30B 31/22* (2013.01); *H01L 21/02645* (2013.01); *H10D 62/8503* (2025.01)

(56) References Cited

U.S. PATENT DOCUMENTS

| | | | |
|---|---|---|---|
| 2014/0319535 A1 | 10/2014 | Komiyama et al. | |
| 2018/0047557 A1 | 2/2018 | Odnoblyudov et al. | |
| 2019/0382918 A1 | 12/2019 | Nagasawa et al. | |
| 2020/0335418 A1* | 10/2020 | Odnoblyudov | .......... H01P 1/30 |

FOREIGN PATENT DOCUMENTS

| | | |
|---|---|---|
| JP | 2936916 B2 | 8/1999 |
| JP | 2014/216474 A | 11/2014 |
| JP | 6042545 B2 | 12/2016 |
| JP | 2018-203587 A | 12/2018 |
| JP | 2019-523994 A | 8/2019 |
| JP | 6626607 B2 | 12/2019 |
| JP | 2020-161833 A | 10/2020 |
| WO | 2017/218536 A1 | 12/2017 |
| WO | 2017/222873 A1 | 12/2017 |

OTHER PUBLICATIONS

May 10, 2022 International Search Report issued in International Patent Application No. PCT/JP2022/009490.

May 10, 2022 Written Opinion issued in International Patent Application No. PCT/JP2022/009490.

Kumagai et al., "Preparation of a Freestanding AlN Substrate by Hydride Vapor Phase Epitaxy at 1230 degrees Celsius Using (111)Si as a Starting Substrate", Japanese Journal of Applied Physics, vol. 46, No. 17, 2007, pp. L389-L391.

Satoh et al., "Development of Aluminum Nitride Single Crystal Substrates", SEI Technical Review, No. 177, Jul. 2010, pp. 88-91.

Kato et al., "AlN Bulk Single Crystals Growth", Fujikura Technical Review, No. 119, 2010, vol. 2, pp. 33-38.

"Prospects for Aluminum Nitride Deep UV LEDs", LED Magazine Japan, Dec. 2016, pp. 30-31.

Nov. 23, 2025 Office Action issued in Korean Patent Application No. 10-2023-7028609.

Mar. 21, 2026 Office Action issued in Singapore Patent Application No. 11202306306U.

* cited by examiner

SEED SUBSTRATE FOR EPITAXIAL GROWTH USE AND METHOD FOR MANUFACTURING SAME, AND SEMICONDUCTOR SUBSTRATE AND METHOD FOR MANUFACTURING SAME

TECHNICAL FIELD

The present invention relates to seed substrates used for epitaxial growth of epitaxial substrates and solid substrates of group III nitrides with few defects and excellent characteristics, such as aluminum nitride (AlN), aluminum gallium nitride ($Al_xGa_{1-x}N$ (0<x<1)), and gallium nitride (GaN), and manufacturing method thereof. More specifically, it relates to seed substrates for epitaxial growth of epitaxial substrates and solid substrates of group III nitrides such as AlN, $Al_xGa_{1-x}N$ (0<X<1) and GaN-based materials with extremely low crystal defects, warpage and voids, and high quality and low cost, and manufacturing method thereof.

BACKGROUND ART

Group III nitride crystal substrates such as AlN- and GaN-based substrates have a wide band gap and excellent high-frequency characteristics with short wavelength luminescence and high breakdown voltage. Therefore, group III nitride substrates are expected to be applied to devices such as light-emitting diodes (LEDs), lasers, Schottky diodes, power devices, and high-frequency devices. For example, with regard to AlN-based crystal substrates, the recent outbreak of coronavirus and other viruses has triggered a growing demand for AlN and/or AlxGa1-Xn (0.5<X<1) single crystals for light emitting diodes, especially in the deep ultraviolet region (UVC; 200-280 nm), for the purpose of bacterial and virus elimination. However, at present, these single-crystal substrates of AlN and/or AlxGa1-Xn (0.5<X<1) have many defects, are of low quality and high cost, and do not have the expected characteristics when various devices are made. Hence, the wide spread of these substrates and the expansion of their applications are limited. On the other hand, GaN-based crystal substrates are required to have higher high-frequency characteristics and greater breakdown voltage performance with the start of 5G communications and the shift to Evs in automobiles. As a result, GaN-based crystal substrates with very few crystal defects and low-cost epitaxial substrates and solid substrates are also in demand. However, as with AlN-based substrates, GaN-based substrates also have many crystal defects and are of low quality, but their prices are high. Therefore, the widespread use of GaN-based substrates for the aforementioned devices has been prevented, and further improvement is desired.

For example, as described in Non-Patent Document 1 and Non-Patent Document 2, AlN single-crystal substrates are difficult to manufacture by the melt method commonly used for silicon (Si) single-crystals, etc. because AlN has no melting point. So they are usually manufactured by the sublimation method (modified Raleigh method) using silicon carbide (SiC) or AlN as seed crystals at 1700 to 2250° C. under an $N_2$ atmosphere. Alternatively, they are made by the hydride vapor phase epitaxy (HVPE) on sapphire substrates or AlN substrates obtained by the sublimation method, as disclosed in Patent Document 1 and Non-Patent Document 3. Since AlN single crystals manufactured by the sublimation method require high temperatures for crystal growth, only small-diameter substrates of 2 to 4 inches in diameter can be obtained at present due to equipment limitations, and they are extremely expensive. The dislocation density of the resulting AlN single crystals is relatively low at <$10^5$ cm$^{-2}$, but on the other hand, the crystals are colored by carbon and metallic impurities derived from charcoal materials such as crucibles and insulation materials, and have the disadvantages of low resistivity and low UV transmission. On the other hand, AlN single crystals made by hydride vapor phase epitaxy (HVPE) on sapphire substrates are relatively inexpensive and have little coloration, but the difference in lattice constants between AlN and sapphire results in high dislocation density and low resistivity of the AlN crystal. AlN crystals obtained by HVPE deposition on sublimation method AlN substrates have relatively low dislocation density, but are opaque to deep UV emission and have low resistivity due to colorant contamination from the underlying substrate AlN. In addition, the conventional use of expensive sublimation method AlN substrates as a base substrate that also serves as seed crystals has the disadvantage of being extremely costly.

As for GaN substrates, bulk GaN substrates made by growing GaN crystals in liquid ammonia or Na flux have relatively few defects and are of high quality, but they are extremely expensive because they require high-temperature, high-pressure equipment. In addition, it is incredibly costly because it is used as a base substrate that also serves as a seed crystal, as is the case with the AlN substrate of the sublimation method described above. On the other hand, if heteroepitaxial growth is performed on sapphire and other substrates using the MOCVD or hydride vapor deposition (HVPE or THVPE), which grow crystals in the vapor phase, it is possible in principle to achieve higher crystal quality and larger size. In practice, however, the lattice constants and thermal expansion coefficients between the generated GaN crystals and the underlying sapphire substrate differ significantly, resulting in numerous crystal defects and cracks during production, and high-quality crystals cannot be obtained.

As one of the solutions to these problems, Patent Document 2 discloses a so-called QST (product name) substrate having a support substrate with an AlN ceramic core and an encapsulating layer that encapsulates the AlN ceramic core with a $SiO_2/P$—$Si/SiO_2/Si_3N_4$ multilayer film, a planarizing layer such as $SiO_2$ on the top surface of the support substrate, and a seed crystal layer with Si<111> thinly transferred as a seed crystal on the top surface of the planarizing layer.

However, this method is likely to cause thermal expansion coefficient differences between layers of the multilayer film that encapsulates the core, or between the encapsulating layer, planarizing layer, and seed crystal layer. In addition, thermal stress based on the difference in thermal expansion coefficient causes cracks, chips, or distortion between the encapsulating layer, planarizing layer, seed crystal layer, or between each layer formed in the epitaxial deposition process in subsequent processes, etc. As a result, it was found that contamination and various distortions caused by impurity diffusion in the AlN ceramic core were induced in the seed crystal, which adversely affected subsequent epitaxial growth, resulting in poor characteristics of the epitaxial-grown film with many crystal defects.

Therefore, it is difficult to obtain, for example, AlN and/or $Al_xGa_{1-x}N$ (0<X<1) substrates for light-emitting diodes used in the ultra-short wavelength deep ultraviolet region (UVC; 200-280 nm), which require especially low crystal defects and excellent characteristics, or GaN crystal substrates suitable for high frequency and high breakdown voltage for 5G communications and Evs, etc. with low crystal defects, high quality and at a low cost, and new solutions have been desired.

The inventors have therefore studied various ways to solve the above problems, and as a result, have arrived at the present invention. That is, one of the key components of the invention is to minimize the difference in thermal expansion coefficient between each multilayer film encapsulating the core, or between the encapsulating layer, planarizing layer, and seed crystal layer, and to optimize the thickness between the encapsulating layer, planarizing layer, and seed crystal layer in a balanced manner, especially by optimizing the composition and thickness of the encapsulating layer and/or by adding a stress-adjusting layer if necessary to minimize thermal stress and to reduce stress even further.

On the other hand, although the role of seed crystals has been understood, there has not been an in-depth study of their elementary properties. In particular, the causal relationship between the elemental properties of Si<111> seed crystals and a subsequent epitaxial film had not been thoroughly investigated. Therefore, the inventors investigated the effect of elementary properties of Si<111> seed crystal on the epitaxial film by eliminating as many as possible factors such as distortion and contamination from the core due to the thermal stress difference that occurs between the aforementioned layers, by optimizing the composition of each layer and minimizing the thermal stress between each layer.

As a result, the inventors found that in order to obtain seed substrates for epitaxial growth of group III nitrides such as AlN, $Al_xGa_{1-x}N$ (0<X<1), GaN, etc. with few defects, excellent characteristics and low cost, in addition to the above-mentioned strain and contamination, oxidation-induced stacking faults (OSF) described in Patent Document 3 has a significant influence on the properties of Si<111> seed crystal. That is, the inventors found that the less OSF in Si<111> seed crystals, the fewer defects in the epitaxial film, and the better the subsequent device characteristics.

It is generally accepted that the amount of oxidation-induced stacking faults (OSF) in Si<111> seed crystals has little effect on defects in the epitaxial film because many crystal defects exist in the conventional epitaxial film. However, the inventors re-examined the situation under conditions where defects during the epitaxial deposition are more apparent and found that there is a significant causal relationship between the Si<111> seed crystal characteristics and defects in the epitaxial film, which is another important component of the present invention.

PRIOR ART DOCUMENTS

Patent Documents

Patent Document 1: JP6042545B
Patent Document 2: JP6626607B
Patent Document 3: JP2936916B

Non-Patent Documents

Non-Patent Document 1: Japanese Journal of Applied Physics; Vol. 46, No. 17, 2007, pp. L389-L391
Non-Patent Document 2: SEI Technical Review; No. 177, pp. 88-91
Non-Patent Document 3: Fujikura Technical Review; No. 119, 2010, Vol. 2, pp. 33-38

Non-Patent Document 4: LEDs Magazine Japan; December 2016, pp. 30-31

SUMMARY OF THE INVENTION

Problems to be Solved by the Invention

The present invention was made in view of the above circumstances, and the purpose is to obtain high-quality, inexpensive seed substrates with few crystal defects for epitaxial growth of epitaxial substrates and solid substrates of group III nitrides such as AlN, AlxGa1-Xn (0<X<1) and GaN. To achieve this objective, in the seed substrate for epitaxial growth of the present invention, the thermal expansion coefficient difference is minimized, and stress is reduced by optimizing the composition and thickness of each layer of the multilayer film that encapsulates the core that serves as the base substrate, or the encapsulating layer, planarizing layer, and Si<111> seed crystal layer. A 0.1 to 1.5 µm thin film of Si<111> single crystal with oxidation-induced stacking faults (OSF) of 10 defects/cm$^2$ or less was transferred to the top surface of the planarizing layer and used as the seed crystal layer. The number of oxidation-induced stacking faults (OSF) (defects/cm$^2$) was measured by the evaluation method of Patent Document 3. Although it becomes more difficult to measure defect density as the thickness of the seed crystal layer becomes thinner, the defect density is not expected to change with thin film transfer.

In the present invention, it is important to minimize the thermal expansion coefficient difference between each layer of the multilayer film, or between the encapsulating layer, planarizing layer, and seed crystal layer, as much as possible. For this purpose, it is essential to optimize the composition and thickness of the encapsulating layer, planarizing layer, and seed crystal layer in a balanced manner. In particular, by optimizing the composition and thickness of the encapsulating layer and/or adding a stress-adjusting layer, if necessary, to lower the stress, and by thin film transfer of 0.1 to 1.5 µm of Si<111> single crystal with oxidation-induced stacking faults (OSF) of 10 defects/cm$^2$ or less on the top surface of the planarizing layer as a seed crystal layer, the expected crystal defects are low, enabling excellent characteristics and low cost.

Means for Solving the Problems

In order to achieve the above-mentioned purpose, a seed substrate for epitaxial growth of the present invention has a support substrate, a planarizing layer of 0.5 to 3 µm provided on the top surface of the support substrate, and a seed crystal layer provided on the top surface of the planarizing layer. The support substrate includes a core of group III nitride polycrystalline ceramics and a 0.05 to 1.5 µm encapsulating layer that encapsulates the core. The seed crystal layer is provided by thin-film transfer of 0.1 to 1.5 µm of the surface layer of Si<111> single crystal with oxidation-induced stacking faults (OSF) of 10 defects/cm$^2$ or less.

In the present invention, the group III nitride polycrystalline ceramics forming the core may be AlN ceramics.

In the present invention, the encapsulating layer may include at least a layer of $Si_3N_4$.

In the present invention, the planarizing layer may be made of $SiO_2$ and/or silicon oxynitride ($Si_xO_yN_z$) or AlAs.

In the present invention, the electrical resistivity (at room temperature) of Si<111> that forms the seed crystal layer may be 1 KΩ-cm or higher.

In the present invention, a stress-adjusting layer may be provided on the bottom surface of the support substrate.

In the present invention, the encapsulating layer may be deposited by the LPCVD.

In the present invention, the planarizing layer may be made of $SiO_2$ and/or silicon oxynitride $(Si_xO_yN_z)$ or AlAs on one or all sides of the top surface of the support substrate by either plasma CVD, LPCVD, or low-pressure MOCVD.

In the present invention, the seed crystal layer may be provided by ion implanting hydrogen and/or He into Si<111> single crystals with an OSF of 10 defects/cm$^2$ or less and an electrical resistivity (room temperature) of 1 $K\omega$-cm or higher, followed by transferring a 0.1 to 1.5 $\mu$m thin film by physical means at 450° C. or lower.

In the present invention, the stress-adjusting layer may be selected from. $SiO_2$, $Si_3N_4$, amorphous Si, polycrystalline Si, etc., or a combination of thereof, which have a thermal expansion coefficient that can correct the warpage after the planarizing layer is provided. Here, when considering even the compatibility to the electrostatic chuck of the process equipment in the device manufacturing process, polycrystalline Si prepared at least by a method selected from sputtering, plasma CVD, and LPCVD is suitable for the bottom layer of the support substrate. Furthermore, it is suitable to interpose $SiO_2$ and/or silicon oxynitride $(Si_xO_yN_z)$ between the polycrystalline Si layer and the support substrate to improve the affinity between the encapsulating layer and the stress-adjusting layer. When using polycrystalline Si film as both the stress-adjusting film and the chucking film for the electrostatic chuck, polycrystalline Si can be deposited directly, or amorphous Si can be deposited as described above and then polycrystallized by heating or laser irradiation. The reason for placing the polycrystalline Si film at the bottom layer is that, when considering the compatibility with the electrostatic chuck of the process equipment, the smaller the distance between the surface of the electrostatic chuck and the chuck-compatible film and the lower the resistivity of the chuck-compatible film, the stronger the electrostatic adsorption force.

The semiconductor substrate of an embodiment of the present invention is characterized in that a III-V semiconductor thin film is deposited on the top surface of a seed substrate for epitaxial growth of either of the above. The III-V semiconductor thin film may be a nitride semiconductor thin film containing Ga and/or Al.

The manufacturing method of a seed substrate for epitaxial growth in accordance with an embodiment of the present invention includes steps of: preparing a core consisting of group III nitride polycrystalline ceramics; obtaining a support substrate by depositing an encapsulating layer so as to wrap the core, the encapsulating layer having a thickness of 0.05 to 1.5 $\mu$m; depositing a planarizing layer on an upper surface of the support substrate, the planarizing layer having a thickness of 0.5 to 3.0 $\mu$m; and providing a seed crystal layer by thin-film transfer of 0.1 to 1.5 $\mu$m of the surface layer of Si<111> single crystal with oxidation-induced stacking faults (OSF) of 10 defects/cm$^2$ or less on the top surface of the planarizing layer.

In the present invention, the encapsulating layer may be deposited by the LPCVD.

In the present invention, the planarizing layer may be made of $SiO_2$ and/or silicon oxynitride $(Si_xO_yN_z)$ or AlAs on one or all sides of the top surface of the support substrate by either plasma CVD, LPCVD or low-pressure MOCVD.

In the present invention, the seed crystal layer may be provided by ion implanting hydrogen and/or He into Si<111> single crystals with OSF of 10 defects/cm$^2$ or less and an electrical resistivity (room temperature) of 1 $K\omega$-cm or higher, followed by transferring a 0.1 to 1.5 $\mu$m thin film by physical means at 450° C. or lower.

The present invention may further comprise a step of further providing a stress-adjusting layer on the bottom surface of the support substrate. This stress-adjusting layer may have a thermal expansion coefficient that enables further correction of the warpage after the planarizing layer is provided, and may be made of polycrystalline Si prepared by a method selected from at least the sputtering and LPCVD.

The manufacturing method of a semiconductor substrate according to an embodiment of the present invention comprises the steps of: manufacturing a seed substrate for epitaxial growth by any of the above methods; and depositing a III-V semiconductor thin film on the top surface of the seed substrate for epitaxial growth.

Effect of the Invention

The present invention enables to provide high-quality and low-cost seed substrates for epitaxial growth of epitaxial substrates and solid substrates of group III nitrides such as AlN and/or AlxGa1-Xn (0<X<1) substrates for light emitting diodes used in the deep ultraviolet region (UVC; 200-280 nm), or GaN crystal substrates suitable for high frequency and high breakdown voltage applications associated with 5G communication and shift to Evs in automobiles, with few defects and at low cost.

EMBODIMENTS OF THE INVENTION

The embodiments of the present invention will be described in detail hereinafter, but the present invention is not limited thereto.

Figure 1:
FIG. 1 is a diagram showing the cross-sectional structure of a seed substrate 1.
Figure 1:
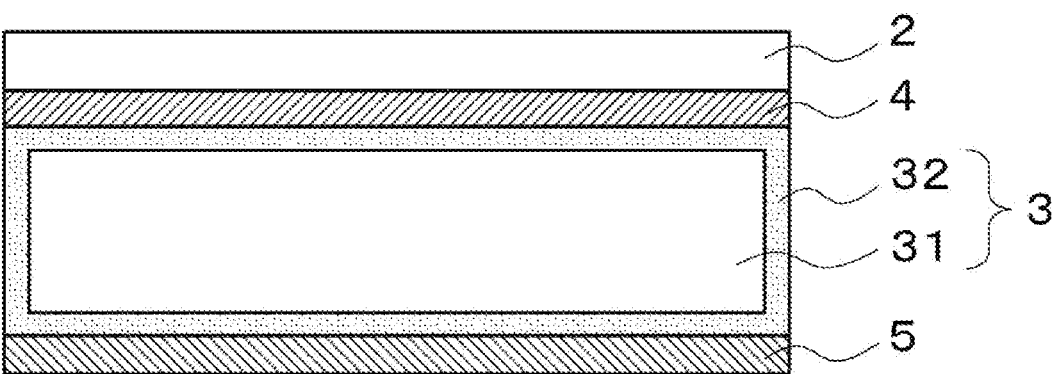

FIG. 1 shows a cross-sectional structure of a seed substrate for epitaxial growth of group III nitrides (hereinafter simply referred to as "seed substrate") 1. The seed substrate 1 shown in FIG. 1 has a structure in which a planarizing layer 4 and a Si<111> seed crystal layer 2 are stacked on a support substrate 3. In addition, if necessary, the stress-adjusting layer 5 is provided on the surface (bottom surface) of the support substrate 3 opposite the surface on which the planarizing layer 4 is stacked.

The support substrate 3 has a core 31 serving as the core material of the support substrate 3, and an encapsulating layer 32 covering the core 31.

The core 31 is formed by group III nitride polycrystalline ceramics. Specifically, AlN, $Si_3N_4$, GaN, or a mixture of these materials can be used. Polycrystalline AlN ceramics are suitable because they have the lattice constant and thermal expansion coefficient close to those of the target group III nitride crystal, have high thermal conductivity, and are inexpensive. In terms of device processing, wafers with a mirror finish of 200 to 1000 $\mu$m thickness should be selected, which can be handled in semiconductor production lines. There are various manufacturing methods for AlN ceramics, but because of their productivity, the so-called sheet forming/atmospheric pressure sintering method is commonly used. In the sheet forming/atmospheric pressure sintering method, AlN powder, sintering agent, organic binders, and solvents are mixed to create wafer-like green sheets, which are then defatted, sintered in an $N^2$ atmosphere, and polished to make products. The sintering agent may be selected from $Y_2O_3$, $Al_2O_3$, CaO, and the like, but $Y_2O_3$ is usually suitable because it exhibits the highest thermal conductivity in the substrate after sintering.

If AlN ceramic is used as the core 31 as it is, metallic impurities in the raw materials AlN and $Y_2O_3$ powder, as well as carbon, oxygen, and other impurities from insulation materials, furnace materials, containers, etc. during sintering become a source of contamination, causing adverse effects such as crystal defects and coloration in the target single crystal.

Therefore, an encapsulating layer 32 is provided that wraps and encapsulates the polycrystalline ceramic core 31. Specifically, when encapsulating the core 31 with the encapsulating layer 32, each layer comprising the encapsulating layer 32 must be considered in terms of its composition and thickness so that thermal stress is as small as possible and thermal conduction is as large as possible. In the present invention, it is preferable to optimize the total thickness of the encapsulating layer 32 in the range of 0.05 to 1.5 µm from a manufacturing cost standpoint.

The composition of the encapsulation layer 32 can be selected appropriately in consideration of thermal expansion coefficient and thermal conductivity, but to enhance its impurity diffusion prevention ability, it is preferable to cover and encapsulate the entire core at least with a film consisting of silicon nitride ($Si_3N_4$).

This encapsulating layer 32 may be provided with p-Si as a layer for electrostatic chucking, if necessary, for example, if the use of electrostatic chucking is desired. This p-Si layer may be deposited between the AlN ceramics and the $Si_3N_4$ layer, or possibly together with or under the stress-adjusting layer 5 described below. In such cases, if adhesion between p-Si and AlN core and $Si_3N_4$ is insufficient, a film of $SiO_2$ or silicon oxynitride ($Si_xO_yN_z$) with high adhesion properties may be interposed, taking into account the affinity and thermal expansion coefficient between each layer.

For seed substrates for epitaxial growth of group III nitrides such as GaN for high-frequency applications, especially for very high-frequency applications such as Giga Hz wave or millimeter wave, in order to avoid high-frequency losses in devices fabricated using epitaxial layers grown on the seed substrates, the electrical resistivity (room temperature) of the above Si<111> seed crystal layer 2 is preferably 1 KΩ-cm or more. This is because the Si<111> seed crystal layer 2 with an electrical resistivity (at room temperature) of 1 KΩ-cm or less would cause high-frequency losses due to giga Hz wave or millimeter wave, resulting in device heat generation and high power consumption, and would not provide sufficient characteristics.

When a p-Si film is provided for the electrostatic chuck, its resistance should be as high as possible to provide the necessary adsorption force. The p-Si film may be deposited on the lower layer of core 31, as far away as possible from the seed crystal layer 2 on which the epitaxial film is stacked, or on the lower part of the stress-adjusting layer 5, or may be multi-layered deposited simultaneously with the stress-adjusting layer 5. High-resistance p-Si has a low high-frequency loss, and when placed at the bottom of the support substrate 3, it is close to the electrostatic chuck, so even with high resistance, sufficient electrostatic force is available. Therefore, substrate adsorption is possible sufficiently without doping. To further reduce high-frequency losses, it is more desirable to remove the p-Si layer by back-grinding the substrate at the end of device fabrication. When the stress-adjusting layer 5 is provided, it is preferable to maintain the p-Si resistance as high as possible, but the minimum amount of boron (B), phosphorus (P), or other doping necessary to generate the required electrostatic force is not restricted.

In the encapsulating layer 32, if the thickness of each layer becomes too thick, the stress between the layers increases due to the difference in thermal expansion coefficient, causing delamination between the layers. Therefore, even if films of various compositions are selected and combined, it is not desirable for the thickness of the encapsulating layer 32 to be more than 1.5 µm. On the other hand, in terms of the function of sealing impurities, a thickness of 0.05 µm or less is insufficient to prevent the diffusion of impurities. From the above, the thickness of the encapsulating layer 32 is preferably in the range of 0.05 to 1.5 µm. The deposition method for the encapsulation layer can be selected from conventional deposition methods such as MOCVD, atmospheric pressure CVD, LPCVD, sputtering, etc. The LPCVD is particularly preferred because of the film quality, the film coverage, and the impurity diffusion prevention ability.

A planarizing layer 4 of 0.5 to 3 µm is stacked on the encapsulating layer 32 at least on the top surface of the support substrate 3. The planarizing layer 4 is selected from ordinary ceramic film materials such as $SiO_2$, $Al_2O_3$, $Si_3N_4$, SiC, or silicon oxynitride ($Si_xO_yN_z$), etc., or Si, GaAs, AlAs, etc., which are often used as sacrificial layers for etching, etc. It is preferable to select $SiO_2$ and/or silicon oxynitride ($Si_xO_yN_z$) or AlAs, which are easy to grind or polish during planarization and easy to separate when obtaining solid substrates.

The planarizing layer 4 is normally stacked only on one side of the encapsulating layer 32 from a cost standpoint, but if the warpage is large, it can be deposited to cover the entire encapsulating layer 32. The thickness of the planarizing layer 4 must be thick enough to fill voids and irregularities in the core 31 and encapsulating layer 32, etc., and smooth enough to transfer seed crystals. However, a planarizing layer 4 that is too thick is undesirable because it can cause warping and cracking of the seed substrate 1. Therefore, it is suitable to provide a planarizing layer with a thickness of 0.5 to 3 µm on at least the top surface of the support substrate. This is because if the thickness is less than 0.5 µm, it is almost impossible to fill the voids and irregularities in the AlN ceramics core 31 and encapsulating layer 32, and if the thickness is 3 µm or more, warping by the planarizing layer 4 is likely to occur.

Plasma CVD, LPCVD, or low-pressure MOCVD are suitable for the deposition of the planarizing layer 4 in terms of their required film quality and deposition efficiency. The stacked $SiO_2$ and/or silicon oxynitride ($Si_xO_yN_z$) or AlAs are heat treated for quenching or CMP polished for smoothness, depending on the film conditions, to prepare for thin-film transfer of the seed crystal layer 2 described below.

The seed crystal is selected to be a substrate with a crystal structure similar to group III nitrides such as AlN, $Al_xGa_{1-x}N$ (0<X<1), GaN, etc., which are the subject of the present invention. Therefore, Si<111>, SiC, SCAM, AlN, AlGaN, sapphire, etc. are candidates, but Si<111> is suitable from the viewpoints of ease of large-diameter production, availability of commercial products, and low cost. Among Si<111> crystals, Si<111> single crystals with oxidation-induced stacking faults (OSF) of 10 defects/$cm^2$ or less are particularly suitable, as described above.

This is because when the OSF of Si<111> seed crystal, which is the seed for the next process of epitaxial deposition, is 10 defects/$cm^2$ or less, the epitaxially deposited crystal has fewer defects following the seed crystal, resulting in superior device characteristics and high yield, which leads to low cost. On the other hand, when the OSF exceeds 10 defects/cm², defects in the epitaxially deposited crystal increase greatly, resulting in poor device characteristics, which inevitably worsen yield and lead to high costs.

When the epitaxial substrates and solid substrates obtained by epitaxial deposition on the seed substrates 1 are used for high-frequency devices, especially for 5G and beyond, it is preferable to select Si<111> seed crystals with an electrical resistivity (room temperature) of 1 Kω-cm or higher. This is because if the electrical resistivity (at room temperature) of the Si<111> seed crystal is less than 1 Kω-cm, its resistance causes high-frequency loss, which increases power consumption and generates heat, degrading device characteristics.

Ion implantation limited to hydrogen and/or helium (He) ion species that have little effect on the electrical resistance of the single crystal substrate is performed on the Si<111> seed crystal, and then the ion-implanted surface of the Si<111> seed crystal is bonded to the top surface of the planarizing layer 4, and a thin film of 0.1 to 1.5 μm is peeled off and transferred to the planarizing layer 4 using physical means such as a nail at 450° C. or lower to form the seed crystal layer 2. Unlike heavy elements such as boron (B), light elements such as hydrogen and He are suitable for ion implantation into seed crystals because ion implantation causes little damage to the seed crystal and does not lower its electrical resistance. In addition, peeling and transferring at low temperatures below 450° C. prevents thermal damage to the Si<111> seed crystals, which is unavoidable in the usual smart-cut method of thermal peeling and transferring at high temperatures above 700° C.

The transfer thickness of the seed crystal layer 2 is preferably 0.1 to 1.5 μm. In the ion implantation, the damage layer alone has a thickness of nearly 0.1 μm, and a suitable seed crystal cannot be obtained if the thickness is less than 0.1 μm. In addition, the ion implant machine requires high output ion energy for transfer thicknesses of 1.5 μm or more, and the ion implanter becomes huge in size, requiring a huge investment, which is not economical. Although it may be difficult to measure the defect density directly when the thickness of the seed crystal layer 2 becomes thin (e.g., 1.0 μm or less), the defect density is not expected to change due to thin film transfer, so the OSF defect density in the seed crystal layer 2 is estimated to be 10 defects/cm² or less, the same as that of Si<111> seed crystal.

To be more specific, after ion implanting hydrogen and/or He into the seed crystal to a depth of 0.2 to 3.5 μm, the top surface of the aforementioned planarizing layer 4 and the ion-implanted surface of the seed crystal are bonded. Then, the seed crystal may be peeled off by gas pressure, a nail, or other physical methods at temperatures below 450° C. This is because stress and thermal damage caused by impurity diffusion and thermal stress can easily occur in the seed crystal of the transferred thin film at high temperatures above 450° C.

The top surface of the transferred thin film may then be CMP polished and/or lightly etched with chemicals to remove the inevitable ion implantation damage layer to obtain a seed single-crystal thin film (seed crystal layer 2) with a thickness of 0.1 to 1.5 μm. If higher uniformity is required for ion implantation, SiO₂, etc. can be deposited on the ion implantation surface of the seed substrate before ion implantation, if necessary.

In the present invention, a stress-adjusting layer 5 may be further added to the bottom surface of the support substrate

3, if necessary. For the stress-adjusting layer 5, film material and thickness with a thermal expansion coefficient that enables correction of warpage of the seed substrate 1 caused by forming the planarizing layer 4 are selected. For example, the stress-adjusting layer 5 can be selected from SiO₂, Si₃N₄, amorphous Si, polycrystalline Si, etc. alone or in combination. Here, when considering even the compatibility to the electrostatic chuck of the process equipment in the device manufacturing process, polycrystalline Si prepared at least by a method selected from sputtering, plasma CVD, and LPCVD is suitable for the bottom layer of the support substrate. Generally, it is suitable to deposit polycrystalline Si (p-Si) as the stress-adjusting layer 5, which is also compatible with the electrostatic chuck. SiO₂ and/or silicon oxynitride (Si$_x$O$_y$N$_z$) or the like may be interposed between the polycrystalline Si and the encapsulating layer from the viewpoint of warpage correction and affinity with the encapsulating layer 32. When a polycrystalline Si film that also serves as a chucking film for the electrostatic chuck is used as the stress-adjusting layer 5, polycrystalline Si may be deposited directly, or amorphous Si may be deposited and then polycrystallized by heating or laser irradiation. By providing a polycrystalline Si film as the lowest layer, the distance between the electrostatic chuck surface and the chuck-compatible film can be shortened, and the resistivity of the film can be lowered to increase the electrostatic adsorption force.

Then, with reference to FIG. 2, the procedure for the manufacturing method of the seed substrate for group III nitride epitaxial growth according to the embodiment of the present invention will be described. If a suitable method for forming each layer has already been described in conjunction with the composition of each part of the seed substrate 1, a redundant explanation here is omitted.

Figure 2:
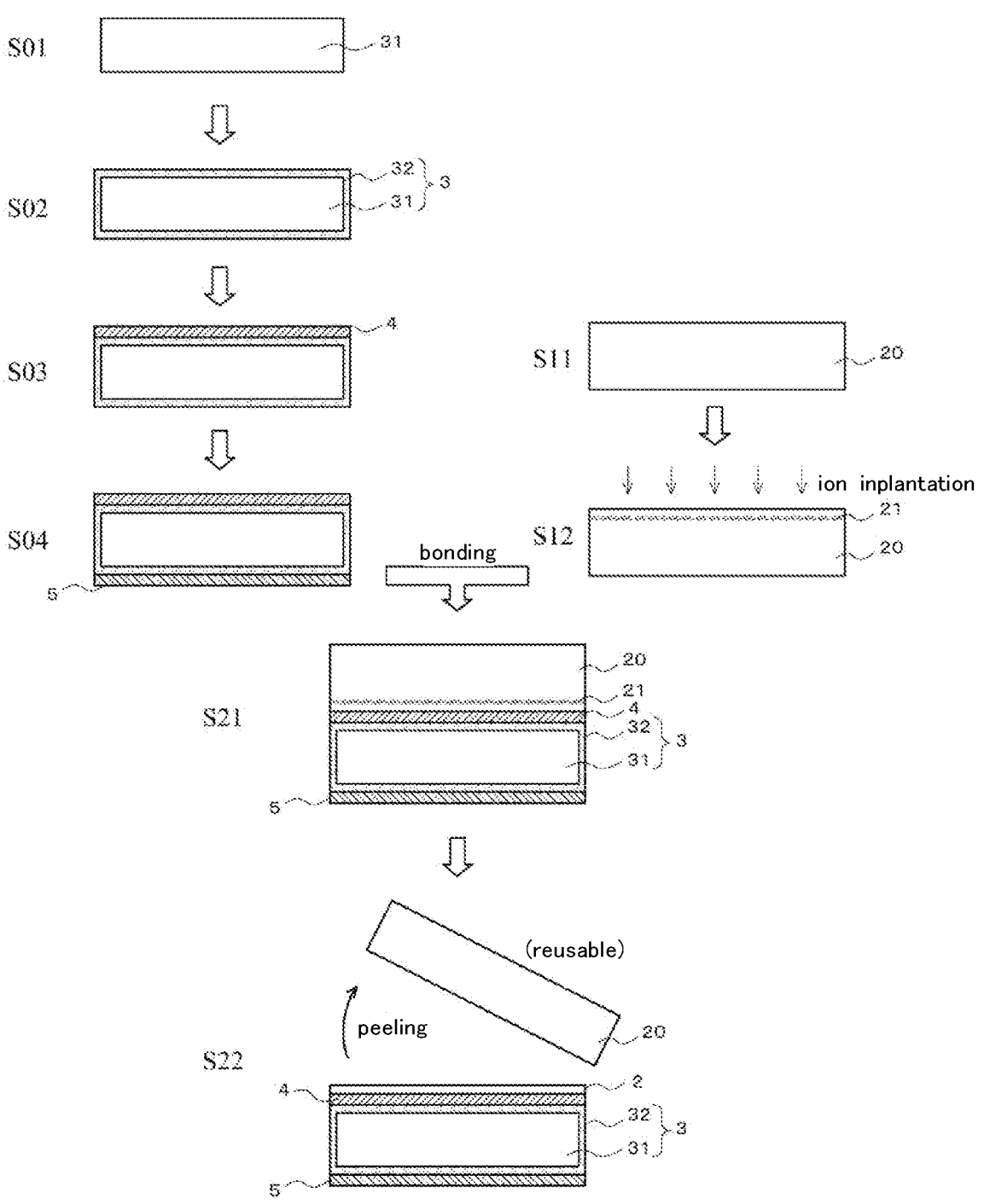
FIG. 2 is a diagram showing the procedure for manufacturing the seed substrate 1.

First, the core 31 consisting of nitride ceramics is prepared (S01 in FIG. 2). Next, the encapsulating layer 32 with a thickness of 0.05 to 1.5 μm, is deposited so as to wrap in the core 31 and the support substrate 3 is obtained (S02 in FIG. 2). In this case, the encapsulating layer 32 may be deposited by using an LPCVD. Next, the planarizing layer 4 with a thickness of 0.5 to 3.0 μm, is deposited on the upper surface of the support substrate 3 (S03 in FIG. 2). If necessary, the stress-adjusting layer 5 is deposited on the bottom surface of the support substrate 3 (S04 in FIG. 2). The planarizing layer 4 and the stress-adjusting layer 5 may be deposited at the same time.

Apart from S01-S04, a Si<111> single-crystal substrate 20, which is a seed crystal for peeling transfer of the seed crystal layer 2, is prepared (S11 in FIG. 2). Next, ion implantation is performed from one surface (ion implantation surface) of the single crystal substrate 20, and a peeling position (embrittlement layer) 21 is formed in the single crystal substrate 20 (S12 in FIG. 2).

Next, the ion implantation surface of the single crystal substrate 20 is bonded to the planarizing layer 4 formed on the support substrate 3 to obtain a bonded substrate (S21 in FIG. 2). Then, the single crystal substrate 20 is separated at the peeling position 21 of the single crystal substrate 20 in the bonded substrate (S22 in FIG. 2). In this way, a single-crystal film of Si<111> is thinly transferred as a seed crystal layer 2 onto the planarizing layer 4 on the support substrate 3. On the other hand, the remaining section of the separated Si<111> single crystal substrate 20 can be repeatedly utilized for transferring a seed crystal layer when fabricating another group III nitride composite substrate by polishing the surface again to make an ion implantation surface.

The above describes the configuration and manufacturing method of the seed substrate 1 for epitaxial growth. The present invention is a synergistic effect of two essential components: 1) minimization of thermal stress between each layer, especially by optimizing the composition and thickness of the encapsulating layer, and 2) growth of excellent epitaxial film crystals by using excellent seed crystals. Secondarily, 3) further stress reduction with a stress-adjusting layer if necessary, and 4) ion implantation limited to light elements of hydrogen and/or He and thin film transfer by physical means such as nails at 450° C. or lower are also effective. The present invention makes it possible to economically obtain epitaxial substrates and solid substrates with very little warpage, voids, crystal defects, etc., and very little high-frequency loss in devices.

The substrate, according to the present invention significantly improves the characteristics of devices, such as light-emitting diodes used in the deep ultraviolet region (UVC; 200-280 nm), high-frequency devices for 5G communications and EV vehicles, and high-voltage devices, while also significantly improving device manufacturing yields.

EXAMPLES

The present invention will be described more specifically hereinafter by citing examples and comparative examples below, but the present invention is not limited to these examples.

Example 1

Preparation of Supporting Substrate

A support substrate 3 with a polycrystalline ceramic core 31 covered with a sealing layer 32 was prepared. A commercially available AlN substrate was used for the polycrystalline ceramic core 31. The AlN substrate was made by mixing 100 wt % AlN powder and 5 wt % $Y_2O_3$ as a sintering agent with organic binders and solvents to make a green sheet, which was then degreased and sintered at 1900° C. under an $N_2$ atmosphere. Both sides polished to φ8 inchesxt725 μm piece was used. The encapsulating layer 32 was formed by covering the entire AlN ceramic core 31 with a 0.1-μm-thick silicon oxynitride layer by LPCVD, and then encapsulating the entire core with a 0.4-μm-thick $Si_3N_4$ layer using another LPCVD apparatus. The total thickness of the encapsulating layer 32 was 0.5 μm. For the purpose of planarization, a 6 μm thick $SiO_2$ was further stacked on the $Si_3N_4$ layer only on one side of the top surface by using plasma CVD (ICP-CVD apparatus). Then, after baking at 1000° C., the $SiO_2$ was planarized by CMP polishing to a thickness of 2 μm (Ra=0.2 nm) in preparation for thin film transfer of the seed crystal.

Preparation of Seed Crystal

A Si<111> single-crystal substrate of 8 inches in diameter and 725 μm in thickness was prepared as the seed crystal substrate. This Si<111> single-crystal substrate had oxidation-induced stacking faults (OSF) of 8 defects/$cm^2$ and an electrical resistivity (room temperature) of 1.5 Kω-cm by the evaluation method described in Patent Document 3. Ion implantation of hydrogen was carried out on the Si substrate at 100 keV, at a depth of 0.6 μm, and with a dose of $8\times10^{17}$ $cm^{-2}$.

A 0.6 μm portion of the surface layer of this ion-implanted Si<111> single crystal was thinly transferred to the planarizing layer 4 (2 μm thickness) of the previously prepared support substrate 3. The section of the Si<111> single crystal, which was damaged during ion implantation and transfer, was lightly polished with CMP, and the thickness of the Si<111> single crystal layer was reduced to 0.4 μm, which was used as seed crystal layer 2. The resulting seed substrate 1 was free of cracks, delamination, and warpage as a result of ensuring that the film thicknesses were balanced with respect to the thermal stresses between each layer of the encapsulating layer 32, the encapsulating layer 32, the planarizing layer 4, and the seed crystal layer 2.

The remaining Si<111> single-crystal substrate after thin-film transfer could be used repeatedly as many seed crystals by repeated ion implantation, which was extremely economical.

A seed substrate 1 with a 2 μm-thick planarizing layer 4 and a 0.4 μm-thick Si<111> single-crystal seed crystal layer 2 on a support substrate 3 with an AlN ceramic core 31 and encapsulating layer 32 was obtained. The following brief evaluation of the characteristics of this seed substrate 1 as a seed substrate for epitaxial growth of GaN was performed.

The above seed substrate 1 was placed in the reactor of the MOCVD apparatus, and epitaxial growth was performed. In this process, the epitaxial layers were deposited in the order of AlN and AlGaN from the seed substrate 1 side toward the growth direction, followed by the epitaxial growth of GaN. The structure of the epitaxial layers is not limited to this, for example, AlGaN may not be deposited, or AlN may be deposited further after AlGaN deposition. In this evaluation, 100 nm of the AlN layer and 150 nm of the AlGaN layer were formed. The total thickness of the epitaxial layer was 5 μm. During epitaxial growth, TMAl (trimethylaluminum) can be used as the Al source, TMGa (trimethylgallium) can be used as the Ga source, and NH3 can be used as the N source, but not limited to these. The carrier gas can be $N_2$ and $H_2$ or any of them. The process temperature preferably be around 900-1200° C.

Then, to evaluate dislocation density, etch pits were generated by a molten alkali (KOH) etching method, and etch pit density (EPD) was measured. In addition, X-ray rocking curve (XRC) measurements were performed to evaluate the crystallinity.

As a result, the EPD showed an extremely low dislocation density of $0.2\times10^4$ $cm^{-2}$. The XRC measurements on a Ga (0002) plane of the substrate yielded a half-value width FWHM (hereafter simply referred to as "FWHM of 0002XRC") of 135 arcsecs, resulting in a high-quality GaN single crystal. These results show that seed substrate 1 in this example has excellent characteristics as a seed substrate for epitaxial growth. When this epitaxial substrate with an epitaxial layer on the seed substrate 1 was used for a 30 GHz/20 Gbps high-frequency device, the surface temperature of the device was 43° C., and there was no temperature increase due to high-frequency loss that would cause a significant problem.

Comparative Example 1

A single-crystal Si<111> single-crystal substrate of 8 inches in diameter with oxidation-induced stacking faults (OS F) of 16 defects/$cm^2$ and an electrical resistivity (room temperature) of 0.2 Kω-cm was used as the seed substrate, and a seed crystal layer 2 with a thickness of 1.3 μm was thinly transferred. Other than that, seed substrate 1 was fabricated under the same conditions as in Example 1. In the same way as in Example 1, 5 μm of GaN was deposited on this seed substrate 1 by MOCVD. As a result, the EPD showed an extremely large dislocation density of $15\times10^4$ $cm^{-2}$. In addition, the FWHM of the 0002 XRC was 930 arcsec, resulting in a GaN single crystal with poor crystallinity compared to Example 1. When this epitaxial substrate was used for 30 GHz/20 Gbps high-frequency devices, the surface temperature of the device reached as high as 125° C. due to high-frequency loss, thus long-term use was not possible.

Example 2

Preparation of Supporting Substrate

A support substrate 3 with a polycrystalline ceramic core 31 covered with a sealing layer 32 was prepared. A commercially available AlN substrate as in Example 1 was used for the polycrystalline ceramic core 31. The encapsulating layer 32 was formed by covering the entire AlN ceramic core 31 with a 0.3-μm-thick $SiO_2$ layer by LPCVD, and then encapsulating the entire core with a 0.8-μm-thick $Si_3N_4$ layer using another LPCVD apparatus. The total thickness of the encapsulating layer 32 was 1.1 μm. For further planarization, 5 μm of silicon oxynitride was stacked on this $Si_3N_4$ layer by LPCVD only on the upper layer of the encapsulating layer 32. After that, the silicon oxynitride layer was CMP polished to a thickness of 2.5 μm. At this stage, the entire substrate warped significantly, approximately 30 μm. To correct the warpage, a 5 μm-thick of silicon oxide layer and a 0.2 μm-thick of non-doped polycrystalline Si layer, which also serves as an electrostatic chuck adsorption layer, were deposited as a stress-adjusting layer 5 on the bottom surface by plasma CVD. As a result, the warpage was eliminated, and sufficient attachment and removal could be performed for the electrostatic chuck.

Preparation of Seed Crystal

A Si<111> single-crystal substrate of 8 inches in diameter and 725 μm in thickness was prepared as the seed crystal substrate. This Si<111> single-crystal substrate had oxidation-induced stacking faults (OSF) of 0 defects/$cm^2$ and an electrical resistivity (room temperature) of 2.3 Kω-cm by the evaluation method described in Patent Document 3. Ion implantation of hydrogen was carried out on the Si substrate at 130 keV, at a depth of 1.4 μm, and with a dose of $9.5 \times 10^{17}$ $cm^{-2}$.

A 1.4 μm portion of the surface layer of this ion-implanted Si<111> single crystal was thinly transferred to the planarizing layer 32 (2.5 μm thickness) of the previously prepared support substrate 3. The section of the Si<111> single crystal, which was damaged during ion implantation and transfer, was lightly polished with CMP, and the thickness of the Si<111> single crystal layer was reduced to 1 μm, which was used as seed crystal layer 2. The resulting seed substrate 1 was free of cracks, delamination, and warpage as a result of ensuring that the film thicknesses were balanced with respect to the thermal stresses between each layer of the encapsulating layer 32, the encapsulating layer 32, the planarizing layer 4, and the seed crystal layer 2.

As in Example 1, the remaining Si<111> single-crystal substrate after thin-film transfer could be used repeatedly as many seed crystals by repeated ion implantation, which was extremely economical.

A seed substrate 1 with a 2.5 μm-thick planarizing layer 4 and a 1 μm-thick Si<111> single-crystal seed crystal layer 2 on a support substrate 3 with an AlN ceramic core 31 and encapsulating layer 32 was obtained. The following brief evaluation of the characteristics of this seed substrate 1 as a seed substrate for epitaxial growth of AlN was performed.

A 600 μm single crystal of AlN was deposited on this seed substrate 1 by THVPE using $AlCl_3$ and $NH_3$ as raw materials. The deposited AlN single crystals were cut into pieces with a wire saw and polished to make smooth 0-inch substrates. The cut AlN single-crystal substrates had no coloration, and the transmittance of light at a wavelength of 220 nm was about 80% with a film thickness of 100 μm. Then, the following brief evaluation was conducted using this substrate as a seed substrate for epitaxial growth of AlN.

2 μm of AlN was deposited on the substrate by MOCVD, and as in the evaluation in Example 1, etch pits were generated by molten alkali (KOH) etching method to evaluate dislocation density, and EPD was measured. In addition, X-ray rocking curve (XRC) measurements were performed to evaluate the crystallinity.

As a result, the EPD showed an extremely low dislocation density of $0.5 \times 10^4$ $cm^{-2}$. In addition, the FWHM of the 0002 XRC was 110 arcsec, resulting in a high-quality AlN single crystal. This AlN single-crystal substrate has very few defects as an LED substrate for the deep-ultraviolet region and is an excellent substrate with excellent device characteristics and low cost.

Example 3

The planarization layer 4 was a two-layer $SiO_2$/AlAs structure with a total thickness of 2.5 μm, consisting of a 2-μm-thick AlAs bottom layer and a 0.5-μm-thick SiO2 top layer. Other than that, seed substrate 1 for epitaxial growth was obtained under the same conditions as in Example 1.

The remaining Si<111> single-crystal substrate after thin-film transfer could be used repeatedly as many seed crystals by repeated ion implantation, which was extremely economical.

A seed substrate 1 with a support substrate 3 having a structure of AlN ceramic core 31 and encapsulating layer 32, a composite planarizing layer 4 of $SiO_2$/AlAs with a total thickness of 2.5 μm, and a 0.4 μm thick Si<111> single crystal seed crystal layer 2 thereon was obtained. Using this seed substrate 1 as a seed substrate for epitaxial growth of GaN, a thick film of GaN was epitaxially grown.

After depositing a 30 μm GaN film on the above seed substrate 1 by MOCVD, the planarizing layer 4 of $SiO_2$/AlAs was dissolved in HF solution to obtain a solid GaN substrate with an approximate thickness of 30 μm.

To evaluate the dislocation density of this solid GaN substrate, etch pits were generated by the molten alkali (KOH) etching method, and EPD was measured, as in the evaluation in Example 1. In addition, X-ray rocking curve (XRC) measurements were performed to evaluate the crystallinity.

As a result, the EPD showed an extremely low dislocation density of $0.05 \times 10^4$ $cm^{-2}$. In addition, the FWHM of the 0002 XRC was 101 arcsec, resulting in a high-quality GaN single crystal. These figures show that the seed substrate 1 in this example is extremely excellent as a seed substrate for epitaxial growth to obtain a solid substrate. The solid GaN substrate obtained by epitaxial growth using this seed substrate 1 was used for high-frequency devices at 30 GHz/20 Gbps. The surface temperature of the device was 38° C., indicating that the substrate was excellent with low heat generation due to high-frequency loss.

REFERENCE SIGNS LIST

1 Seed substrate
2 Seed crystal layer
3 Supporting substrate
4 Planarizing layer
5 Stress-adjusting layer 20 Single crystal substrate of a seed crystal 21 Peeling position

The invention claimed is:

1. A seed substrate for epitaxial growth comprising:

a support substrate;

a planarizing layer provided on an upper surface of the support substrate, the planarizing layer having a thickness of 0.5 to 3.0 μm; and a seed crystal layer provided on an upper surface planarizing layer, wherein the support substrate comprises:

a core formed by group III nitride polycrystalline ceramics; and an encapsulating layer that encapsulates the core, the encapsulating layer having a thickness of 0.05 to 1.5 μm, and the seed crystal layer is provided by thin-film transfer of 0.1 to 1.5 μm of a surface layer of Si<111> single crystal with oxidation-induced stacking faults of no more than 10 defects/cm$^2$.

2. A seed substrate for epitaxial growth comprising:

a support substrate;

a planarizing layer provided on an upper surface of the support substrate, the planarizing layer having a thickness of 0.5 to 3.0 μm; and a seed crystal layer provided on an upper surface planarizing layer, wherein the support substrate comprises:

a core formed by group III nitride polycrystalline ceramics; and an encapsulating layer that encapsulates the core, the encapsulating layer having a thickness of 0.05 to 1.5 μm, and the seed crystal layer has oxidation-induced stacking faults of no more than 10 defects/cm$^2$, and the thickness of the seed crystal layer is 0.1 to 1.5 μm.

3. The seed substrate for epitaxial growth as claimed in claim 1, wherein the group III nitride polycrystalline ceramics forming the core are AlN ceramics.

4. The seed substrate for epitaxial growth as claimed in claim 1, wherein the encapsulating layer includes at least a layer of $Si_3N_4$.

5. The seed substrate for epitaxial growth as claimed in claim 1, wherein the planarizing layer comprises $SiO_2$ and/or silicon oxynitride ($Si_xO_yN_z$) or AlAs.

6. The seed substrate for epitaxial growth as claimed in claim 1, wherein the electrical resistivity (at room temperature) of Si<111> forming the seed crystal layer is 1 kΩ-cm or higher.

7. The seed substrate for epitaxial growth as claimed in claim 1, further comprises a stress-adjusting layer on the bottom surface of the support substrate.

8. The seed substrate for epitaxial growth as claimed in claim 7, wherein the stress-adjusting layer has a thermal expansion coefficient that enables further correction of the warpage after the planarizing layer is provided, and consists of polycrystalline Si prepared by a method selected from at least the sputtering, plasma CVD, and LPCVD.

9. The seed substrate for epitaxial growth as claimed in claim 7, wherein the stress-adjusting layer is provided as polycrystalline Si with $SiO_2$ and/or silicon oxynitride ($Si_xO_yN_z$) interposing just below the bottom surface of the support substrate.

10. The seed substrate for epitaxial growth as claimed in claim 1, wherein the encapsulation layer is deposited by LPCVD.

11. The seed substrate for epitaxial growth as claimed in claim 1, wherein the planarizing layer is formed by depositing $SiO_2$ and/or silicon oxynitride ($Si_xO_yN_z$) or AlAs on one or all sides of the top surface of the support substrate by one of plasma CVD, LPCVD, and low-pressure MOCVD.

12. The seed substrate for epitaxial growth as claimed in claim 1, wherein the seed crystal layer is provided by ion implanting hydrogen and/or He into Si<111> single crystal with oxidation-induced stacking faults of 10 defects/cm$^2$ or less and electrical resistivity (at room temperature) of 1 kΩ-cm or higher, followed by transferring a thin film of the Si<111> single crystal of 0.1 to 1.5 μm by physical means at 450° C. or lower.

13. A semiconductor substrate on which a III-V semiconductor thin film is deposited on the top surface of a seed substrate for epitaxial growth according to claim 1.

14. The semiconductor substrate as claimed in claim 13, wherein the III-V semiconductor thin film is a nitride semiconductor thin film containing Ga and/or Al.

15. A manufacturing method of seed substrate for epitaxial growth comprising:

preparing a core consisting of group III nitride polycrystalline ceramics;

obtaining a support substrate by depositing an encapsulating layer so as to wrap the core, the encapsulating layer having a thickness of 0.05 to 1.5 μm;

depositing a planarizing layer on an upper surface of the support substrate, the planarizing layer having a thickness of 0.5 to 3.0 μm; and providing a seed crystal layer by thin-film transfer of 0.1 to 1.5 μm of the surface layer of Si<111> single crystal with oxidation-induced stacking faults of no more than 10 defects/cm$^2$ on the top surface of the planarizing layer.

16. The manufacturing method of seed substrate for epitaxial growth as claimed in claim 15, wherein the encapsulation layer is deposited by the LPCVD.

17. The manufacturing method of seed substrate for epitaxial growth as claimed in claim 15, wherein the planarizing layer is formed by depositing $SiO_2$ and/or silicon oxynitride ($Si_xO_yN_z$) or AlAs on one or all sides of the top surface of the support substrate by one of plasma CVD, LPCVD, and low-pressure MOCVD.

18. The manufacturing method of seed substrate for epitaxial growth as claimed in claim 15, wherein in the step of providing the seed crystal layer, the seed crystal layer is provided by ion implanting hydrogen and/or He into Si<111> single crystal with oxidation-induced stacking faults of 10 defects/cm$^2$ or less and electrical resistivity (at room temperature) of 1 kΩ-cm or more, followed by transferring a thin film of the Si<111> single crystal of 0.1 to 1.5 μm by physical means at 450° C. or less.

19. The manufacturing method of seed substrate for epitaxial growth as claimed in claim 15, further providing a stress-adjusting layer on the bottom surface of the support substrate.

20. The manufacturing method of seed substrate for epitaxial growth as claimed in claim 19, wherein the stress-adjusting layer has a thermal expansion coefficient that enables further correction of the warpage after the planarizing layer is provided, and consists of polycrystalline Si prepared by a method selected from at least the sputtering, plasma CVD, and LPCVD.

21. A manufacturing method of semiconductor substrate comprising:

manufacturing a seed substrate for epitaxial growth by the manufacturing method of seed substrate for epitaxial growth as claimed in claim 15; and depositing a III-V semiconductor thin film on the top surface of the seed substrate for epitaxial growth.

\* \* \* \* \*